United States Patent
Zhang

(10) Patent No.: US 9,666,650 B2
(45) Date of Patent: May 30, 2017

(54) FLEXIBLE DISPLAY AND MANUFACTURING METHOD THEREOF

(71) Applicant: BOE TECHNOLOGY GROUP CO., LTD., Beijing (CN)

(72) Inventor: Yuxin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 38 days.

(21) Appl. No.: 14/437,128

(22) PCT Filed: Sep. 2, 2014

(86) PCT No.: PCT/CN2014/085731
§ 371 (c)(1),
(2) Date: Apr. 20, 2015

(87) PCT Pub. No.: WO2015/131515
PCT Pub. Date: Sep. 11, 2015

(65) Prior Publication Data
US 2016/0284774 A1  Sep. 29, 2016

(30) Foreign Application Priority Data
Mar. 3, 2014 (CN) .......................... 2014 1 0074937

(51) Int. Cl.
*H01L 27/14* (2006.01)
*H01L 29/04* (2006.01)
(Continued)

(52) U.S. Cl.
CPC .......... *H01L 27/3246* (2013.01); *H01L 21/77* (2013.01); *H01L 51/0097* (2013.01);
(Continued)

(58) Field of Classification Search
CPC .................................................. H01L 27/3211
(Continued)

(56) References Cited

U.S. PATENT DOCUMENTS

2004/0119066 A1* 6/2004 Han ..................... H01L 27/3211
257/40
2006/0113911 A1* 6/2006 Hong ....................... H01J 11/16
313/585
(Continued)

FOREIGN PATENT DOCUMENTS

CN          1625814 A      6/2005
CN        103426904 A     12/2013
(Continued)

OTHER PUBLICATIONS

Nov. 28, 2014—(WO) International Search Report and Written Opinion PCT/CN2014/085731 with Eng Tran.

*Primary Examiner* — Igwe U Anya
(74) *Attorney, Agent, or Firm* — Banner & Witcoff, Ltd.

(57) ABSTRACT

Disclosed are a flexible display and a manufacturing method thereof. The flexible display includes a first flexible substrate, a pixel defining layer and a cathode. The pixel defining layer includes a plurality of first separation walls and a plurality of second separation walls. The first separation wall has protrusions and a first groove with openings far away from the first flexible substrate and extending in the length direction of the first separation wall; and the second separation wall has protrusions and a second groove with an opening far away from the first flexible substrate and extending in the length direction of the second separation wall. A part of the cathode that faces against the first separation wall has a curve shape conforming to the first groove, and a part of the cathode that faces against the second separation wall has a curve shape conforming to the second groove.

20 Claims, 2 Drawing Sheets

(51) Int. Cl.
    *H01L 27/32*     (2006.01)
    *H01L 21/77*     (2017.01)
    *H01L 51/00*     (2006.01)
    *H01L 51/52*     (2006.01)

(52) U.S. Cl.
    CPC .... *H01L 51/5225* (2013.01); *H01L 2227/323* (2013.01); *H01L 2251/5338* (2013.01); *Y02E 10/549* (2013.01); *Y02P 70/521* (2015.11)

(58) Field of Classification Search
    USPC ............................................. 257/72; 438/23
    See application file for complete search history.

(56) References Cited

U.S. PATENT DOCUMENTS

| | | | | |
|---|---|---|---|---|
| 2007/0066179 A1* | 3/2007 | Nakamura | ................. | B41J 2/14 445/46 |
| 2007/0075627 A1* | 4/2007 | Kimura | ............... | H01L 27/3213 313/503 |
| 2007/0085475 A1* | 4/2007 | Kuwabara | ........... | H01L 27/3246 313/506 |
| 2010/0033084 A1* | 2/2010 | Ko | ...................... | H01L 51/5012 313/504 |
| 2014/0159064 A1* | 6/2014 | Sakariya | ............. | H01L 25/0753 257/88 |

FOREIGN PATENT DOCUMENTS

| | | |
|---|---|---|
| CN | 103887261 A | 6/2014 |
| CN | 203746831 U | 7/2014 |
| JP | 2010086704 A | 4/2010 |

* cited by examiner

FLEXIBLE DISPLAY AND MANUFACTURING METHOD THEREOF

The application is a U.S. National Phase Entry of International Application No. PCT/CN2014/085731 filed on Sep. 2, 2014, designating the United States of America and claiming priority to Chinese Patent Application No. 201410074937.3 filed on Mar. 3, 2014. The present application claims priority to and the benefit of the above-identified applications and the above-identified applications are incorporated by reference herein in their entirety.

TECHNICAL FIELD

Embodiments of the present invention relate to a flexible display and a manufacturing method thereof.

BACKGROUND

Flexible displays have many advantages such as yieldingness, impact resistance, high shock resistance, light weight, small volume and portability. At present, flexible display materials may be generally classified into three kinds electronic paper (or flexible electrophoretic display), flexible OLED and flexible liquid crystal.

A flexible display comprises an anode, a pixel defining layer, and a cathode. A flexible display has a pixel area and a non-pixel area. The pixel defining layer has a plurality of transverse separation walls arranged in parallel and a plurality of longitudinal separation walls arranged in parallel in the non-pixel area which are arranged crossing each other to separate a plurality of pixel areas of the flexible display. The anode has electrode patterns in one to one correspondence with pixel areas and located in the pixel areas. Each pixel area has an electroluminescent layer disposed therein. The cathode is a layer entirely formed over the pixel defining layer on a side of the electroluminescent layer away from the anodes. The luminescence of the electroluminescent layer corresponding to each pixel area is controlled by the potential of anode pattern in the pixel unit, thereby controlling the display of the flexible display.

However, the cathode of the flexible display is a plate-shaped electrode made of metals, therefore it tends to break when it is bent due to stress in the bending process of the flexible display, which in turn influences the display quality.

SUMMARY

According to an aspect of the present invention, there is provided a flexible display comprising a first flexible substrate, a pixel defining layer and a cathode, the pixel defining layer being disposed between the first flexible substrate and the cathode, the pixel defining layer comprising a plurality of first separation walls disposed in parallel and a plurality of second separation walls disposed in parallel, the first separation walls and the second separation walls being arranged crossing each other to define a plurality of pixel areas, wherein the first separation wall comprises protrusions protruding toward a side away from the first flexible substrate, the protrusions have an arc shape in cross section of the first separation wall in a direction perpendicular to a length direction of the first separation wall, and the first separation wall further comprises a first groove with an opening away from the first flexible substrate and extending in the length direction of the first separation wall; the second separation wall comprises protrusions protruding toward a side away from the first flexible substrate, the protrusions have an arc shape in cross section of the second separation wall in a direction perpendicular to a length direction of the second separation wall, and the second separation wall further comprises a second groove with an opening away from the first flexible substrate and extending in the length direction of the second separation wall; and a part of the cathode that faces against the first separation wall is disposed along a surface of the first separation wall and has a curve shape same as a shape of the first groove; and a part of the cathode that faces against the second separation wall is disposed along a surface of the second separation wall and has a curve shape same as a shape of the second groove.

According to another aspect of the present invention, there is provided a method of manufacturing a flexible display, comprising:

forming a thin film transistor (TFT) on a first flexible substrate;

forming a first metal layer on the TFT and patterning the first metal layer by patterning process to form an anode pattern;

forming a resin material layer and forming a pixel defining layer pattern comprising a plurality of first separation walls and a plurality of second separation walls by grayscale exposure patterning process, wherein the first separation wall comprises protrusions protruding toward a side away from the first flexible substrate, tops of the protrusions have an arc shape in cross section of the first separation wall perpendicular to the length direction of the first separation wall, and the first separation wall further comprises a first groove with an opening away from the first flexible substrate and extending in the length direction of the first separation wall; and the second separation wall comprises protrusions protruding toward a side away from the first flexible substrate, tops of the protrusions have an arc shape in cross sections of the second separation wall perpendicular to the length direction of the second separation wall, and the second separation wall further comprises a second groove with an opening away from the first flexible substrate and extending in the length direction of the second separation wall;

forming a second metal layer as a cathode on the pixel defining layer pattern, wherein a part of the cathode that faces against the first separation wall is disposed along a surface of the first separation wall and has a curve shape conform to the first groove; a part of the cathode that faces against the second separation wall is disposed along a surface of the second separation wall and has a curve shape conforming to the second groove.

BRIEF DESCRIPTION OF THE DRAWINGS

In order to explain the technical solution of embodiments of the present invention more clearly, accompanying drawings of the embodiments will be introduced briefly below. Obviously, the accompanying drawings in the following description only relate to some embodiments of the present invention rather than limiting the present invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Figure 1:
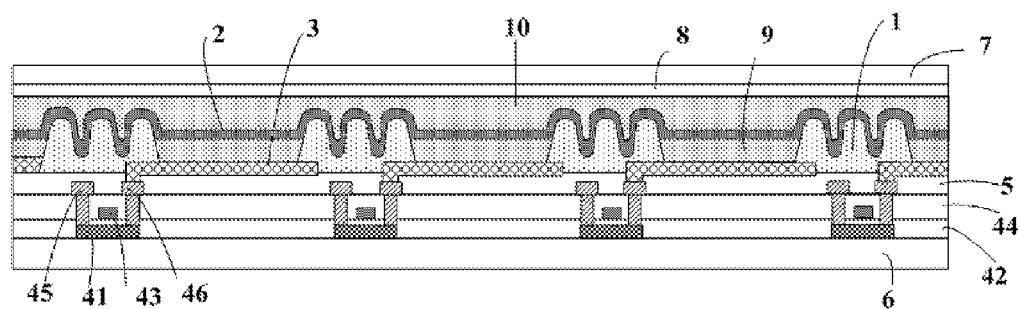
FIG. 1 is a schematic diagram of a cross-section view of a flexible display provided in an embodiment of the present invention.
Figure 2A:
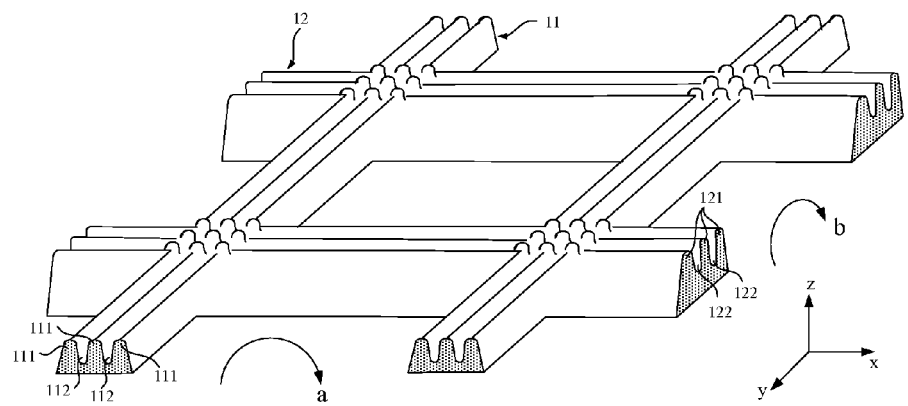
FIG. 2a is a structure diagram of a pixel defining layer in a flexible display provided in an embodiment of the present invention.

An embodiment of the present invention provides a flexible display illustrated in FIG. 1, comprising a first flexible substrate 6, on which a pixel defining layer 1 and a cathode 2 are formed successively. The pixel defining layer 1 is located between the first flexible substrate 6 and the cathode 2. As illustrated in FIG. 2a, the pixel defining layer 1 comprises a plurality of first separation walls 11 arranged in parallel and a plurality of second separation walls 12 arranged in parallel. The first separation walls 11 and second separation walls 12 are arranged crossing each other to define a plurality of pixel areas. The pixel defining layer 1 is a pixel defining layer made of resin material, such as a photosensitive resin material.

The first separation wall 11 has protrusions 111 protruding toward a side away from the first flexible substrate 6. In a cross section of first separation wall 11 in a direction perpendicular to the length of the first separation wall 11, tops of protrusions 111 are of arc shape. The protrusions 111 of first separation wall 11 are formed with first grooves 112 with openings away from the first flexible substrate 6 and extending in the length direction of first separation wall 11.

The second separation wall 12 has protrusions 121 protruding toward the side away from the first flexible substrate 6. In a cross section of second separation wall 12 in a direction perpendicular to the length of the second separation wall 12, tops of protrusions 121 are of arc shape. The protrusions 121 of second separation wall 12 are formed with second grooves 122 with openings away from the first flexible substrate 6 and extending in the length direction of second separation wall 12.

A part of the cathode 2 that faces against the first separation wall 11 is disposed along the surface of the first separation wall 11, such that the part of the cathode 2 that faces against the first separation wall 11 forms a shape conforming to the surface shape of the side of first separation wall 11 away from the first flexible substrate 6, thereby allowing the part of the cathode 2 that faces against the first separation walls 11 has a curve shape conforming to the first grooves 112. Meanwhile, a part of the cathode 2 that faces against the second separation walls 12 is disposed along the surface of the second separation walls 12 such that the part of the cathode 2 that faces against the second separation walls 12 forms a shape conforming to the surface shape of the side of the second separation walls 12 away from the first flexible substrate 6, thereby allowing the part of the cathode 2 that faces against the second separation walls 12 has a curve shape conforming to the second grooves 121.

In the flexible display of the above embodiment, the stress concentration which results in the deformation of cathode 2 is reduced and stress is released by the curve part of the cathode 2, thereby preventing the cathode 2 from breaking.

Figure 2B:
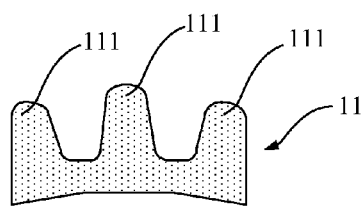
FIG. 2b is a structure diagram of a first separation wall in the pixel defining layer of FIG. 2a while the first separation wall is deformed by force.

Therefore, as illustrated in FIG. 2b, when the flexible display is bent about X axis in b direction as arrowed in FIG. 2a, that is, bent in the length direction of first separation walls 11, the second separation walls 12 may be deformed in a direction perpendicular to the extension direction of second grooves 122, whereas the curve part of cathode 2 that faces against the second grooves 122 is deformed together with the second grooves 122 and releases stresses through the deformation of the curve part, thereby avoiding breaking of the cathode 2.

Similarly, when the flexible display is bent about Y axis in a direction arrowed in FIG. 2a, that is, bent in the length direction of second separation walls 12, the first separation walls 11 may be deformed in a direction perpendicular to the extension direction of first grooves 112, whereas the curve part of cathode 2 that faces against the first grooves 112 is deformed together with the first grooves 112 and releases stresses through the deformation of the curve part, thereby avoiding breaking of the cathode 2.

Therefore, when the above-mentioned flexible display is bent in the length direction of the first separation walls 11 or in the length direction of the second separation walls 12, the cathode 2 can release stresses applied thereto so as to reduce the risk of breaking the cathode 2 due to the bending stress and improve the quality of the flexible display. It is to be noted the flexible display of the present invention can be bent not only in a or b directions in FIG. 2a, but also in other directions. For example, in case that the flexible display is bent about a direction with a 45 degree angle with respect to X axis, the bending stress would act on the intersections between first separation walls 11 and second separation walls 12, at this time, it is also possible to release the applied stress by deformation of the curve part of the cathode 2 and prevent the cathode 2 from being broken.

It is to be noted that in the flexible display provided in the present invention, there may be two or more protrusions on each of the first separation walls 11, and there may be two or more protrusions on each of the second separation walls 12. The more protrusions, the better flexibility the flexible display has. The numbers of protrusions may be set specifically as required.

Based on the above-mentioned implementations, the first separation walls 11 may be of the following two forms.

For example, as illustrated in FIG. 2a, the first separation wall 11 comprises a plurality of strip-shaped protrusions 111 extending in the length direction of the first separation walls 11 and a first groove 112 is formed between any two adjacent strip-shaped protrusions 111.

Figure 3:
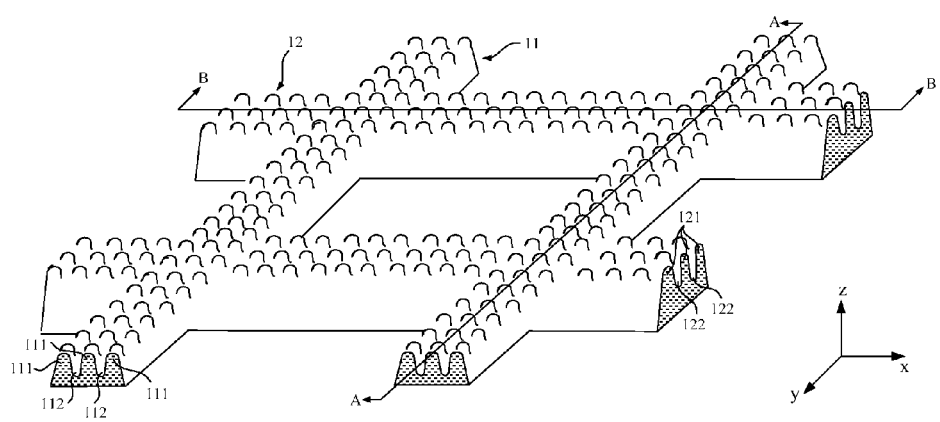
FIG. 3 is another structure diagram of a pixel defining layer in a flexible display provided in an embodiment of the present invention.
Figure 4:
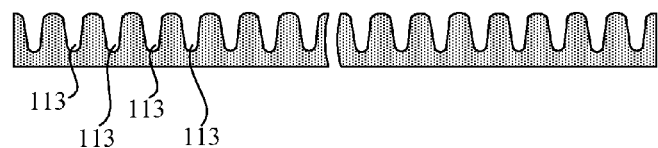
FIG. 4 is a sectional view in A-A direction shown in FIG. 3.

Alternatively, for example, as illustrated in FIG. 3, the first separation wall 11 comprise a plurality of protrusions 111 arranged in an array, each column of protrusions 111 are arranged in a direction parallel to the length direction (e.g., Y direction) of the first separation walls 11, each row of protrusions 111 are arranged in a direction parallel to the length direction (e.g., X direction) of the second separation walls 12, and a first groove 112 is formed between any two adjacent columns of protrusions 111. As illustrated in FIG. 4, a third groove 113 extending in a direction parallel to the extending direction of the second groove 122 is formed between any two adjacent rows of protrusions, the third groove 113 has a width equal to that of the second groove 122. Similarly, each second separation wall 12 may be of the following two forms.

As illustrated in FIG. 2a, the second separation wall 12 comprises a plurality of strip-shaped protrusions 121 extending in the length direction of the second separation wall 12 and a second groove 122 is formed between any two adjacent strip-shaped protrusions 121.

Figure 5:
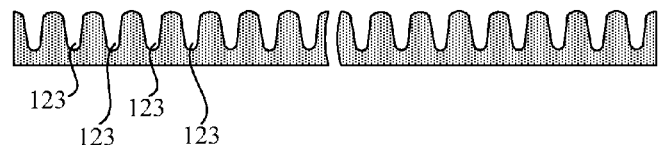
FIG. 5 is a sectional view in B-B direction shown in FIG. 3.

Alternatively, as illustrated in FIG. 3, the second separation wall 12 comprises a plurality of protrusions 121 arranged in an array, each row of protrusions 121 are arranged in a direction parallel to the length direction (e.g., X direction) of the second separation wall 12, each column of protrusions 121 are arranged in a direction parallel to the length direction (e.g., Y direction) of the first separation wall 11, and a second groove 122 is formed between any two adjacent rows of protrusions 121. As illustrated in FIG. 5, a fourth groove 123 extending in a direction parallel to the extending direction of the first groove 112 is formed between any two adjacent columns of protrusions 121, the fourth groove 123 has a width equal to that of the first groove 112.

FIGS. 2a and 3 only show a configuration in which the first separation walls 11 and the second separation walls 12 are of the same form. In other embodiments of the present invention, protrusions of the first separation walls 11 and of the second separation walls 12 may be in different forms. For example, the first separation wall 11 comprises a plurality of strip-shaped protrusions 111, whereas the second separation wall 12 comprises a plurality of protrusions 121 disposed in an array. When the first separation walls 11 and the second separation walls 12 have protrusions with the same form, it is possible to use protrusions of different forms between the intersections and non-intersections of the first separation walls 11 and the second separation walls 12. For example, in FIG. 2a, protrusions of array form are located at intersections, while strip-shaped protrusions are located at non-intersection locations. Alternatively, protrusions at intersections and non-intersection locations are both of the same form, for example as illustrated in FIG. 3.

As illustrated in FIG. 1, in an exemplary implementation, the above-mentioned flexible display further comprises a thin film transistor (TFT, i.e., switch TFT), a first passivation layer 5 and anodes 3, all of which are formed successively on the first flexible substrate 6. The TFT, the first passivation layer 5 and anodes 3 are located between the pixel defining layer 1 and the first flexible substrate 6, and each anode 3 is connected with a drain 46 of its corresponding TFT through a via. The above-mentioned flexible display further comprises an organic luminescent layer 9 located in each pixel area and between the anode 3 and the cathode 2.

For example, the TFT is a top-gate TFT which comprises: an active layer 41, a gate insulating layer 42, a gate 43, an interlayer insulating layer 44, a source 45 and a drain 46 formed successively on the first flexible substrate 6; the source 45 and the drain 46 are connected with the active layer through vias respectively.

Alternatively, the TFT is a bottom-gate TFT (not shown) comprising:
a gate, a gate insulating layer, an active layer, a source and a drain formed successively on the first flexible substrate 6.

In the above-mentioned flexible display, the deeper the first groove 112 and the second groove 122 are, the better flexibility the flexible display has, and the more unlikely the cathode is broken when the flexible display is bent.

In an exemplary implementation, the first grooves 112 provided in the first separation walls 11 are deep enough to contact the first passivation layer 5; and/or the second grooves 122 provided in the second separation walls 12 are deep enough to contact the first passivation layer 5.

In another exemplary implementation, as illustrated in FIG. 1, in the above-mentioned flexible display, a second passivation layer 10 and a second flexible substrate 7 which is bonded on a side of the second passivation layer 10 away from the cathode 2 by a bonding layer 8, are provided successively on a side of the cathode 2 away from the first flexible substrate 6.

Figure 6:
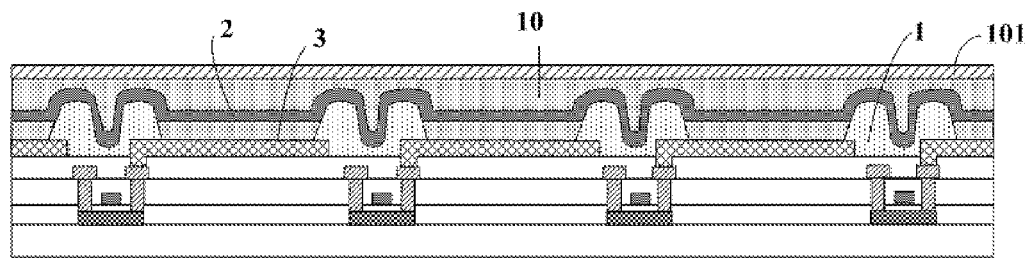
FIG. 6 is a schematic diagram of another cross-section view of a flexible display provided in an embodiment of the present invention.

In yet another exemplary implementation, as illustrated in FIG. 6, in the above-mentioned flexible display, a second passivation layer 10 and an encapsulation film 101 are provided successively on a side of the cathode 2 away from the first flexible substrate 6.

Thus, the display device is encapsulated by both the second passivation layer 10 and the second flexible substrate 7, or both the second passivation layer 10 and the encapsulation film 101 to increase the service life of the flexible display.

The above-mentioned flexible display has a configuration of top-emission, bottom-emission, or inverted flexible display.

An embodiment of the present invention further provides a manufacturing method of a flexible display, comprising:
forming a thin film transistor (TFT) on a first flexible substrate;
forming a first metal layer on the TFT and patterning the first metal layer by patterning process to form an anode pattern;
forming a resin material layer, such as a photosensitive resin material layer, and forming a pixel defining layer pattern comprising first separation walls and second separation walls by using grayscale exposure patterning process, wherein each of first separation walls has protrusions protruding toward a side away from the first flexible substrate, tops of protrusions have an arc shape in the cross section of first separation wall perpendicular to the length direction of first separation wall, and protrusions of first separation walls are formed with first grooves with openings away from the first flexible substrate and extending in the length direction of first separation walls; and each of second separation walls has protrusions protruding toward a side away from the first flexible substrate, tops of protrusions have an arc shape in the cross sections of second separation wall perpendicular to the length direction of second separation wall, and protrusions of second separation walls are formed with second grooves with openings away from the first flexible substrate and extending in the length direction of second separation walls; and
forming a second metal layer as a cathode on the pixel defining layer pattern, wherein a part of the cathode that faces against the first separation walls is disposed along a surface of the first separation walls and has a curve shape conforming to the first grooves; a part of the cathode that faces against the second separation walls is disposed along a surface of the second separation walls and has a curve shape conforming to the second grooves.

In an exemplary implementation, the step of forming the pixel defining layer pattern comprising first separation walls and second separation walls by grayscale exposure patterning process comprises:
forming first separation walls and second separation walls by grayscale exposure patterning process;
forming protrusions on a side of first separation walls away from the first flexible substrate; and forming protrusions on a side of second separation walls away from the first flexible substrate.

What is described above is related to the illustrative embodiments of the disclosure only and not limitative to the scope of the disclosure; the scopes of the disclosure are defined by the accompanying claims.

The present application claims priority of China Patent application No. 201410074937.3 filed on Mar. 3, 2014, which is incorporated in its entirety by reference herein.

The invention claimed is:

1. A flexible display, comprising:
a first flexible substrate;
a cathode; and
a pixel defining layer being disposed between the first flexible substrate and the cathode, the pixel defining layer comprising a plurality of first separation walls disposed in parallel and a plurality of second separation walls disposed in parallel, the first separation walls and the second separation walls being arranged crossing each other to define a plurality of pixel areas, wherein:
the first separation wall comprises protrusions protruding toward a side away from the first flexible substrate, the protrusions have an arc shape in cross section of the first separation wall in a direction perpendicular to a length direction of the first separation wall, and the first separation wall further comprises a first groove with an opening away from the first flexible substrate and extending in the length direction of the first separation wall;
the second separation wall comprises protrusions protruding toward a side away from the first flexible substrate, the protrusions have an arc shape in cross section of the second separation wall in a direction perpendicular to a length direction of the second separation wall, and the second separation wall further comprises a second groove with an opening away from the first flexible substrate and extending in the length direction of the second separation wall; and
a part of the cathode that faces against the first separation wall is disposed along a surface of the first separation wall and has a curve shape same as a shape of the first groove; and a part of the cathode that faces against the second separation wall is disposed along a surface of the second separation wall and has a curve shape same as a shape of the second groove.

2. The flexible display of claim 1, wherein the first separation wall comprises a plurality of strip-shaped protrusions extending in the length direction of the first separation wall and a first groove is formed between any two adjacent strip-shaped protrusions.

3. The flexible display of claim 2, wherein the second separation wall comprises a plurality of strip-shaped protrusions extending in the length direction of the second separation wall and a second groove is formed between any two adjacent strip-shaped protrusions.

4. The flexible display of claim 1, wherein the first separation wall comprises a plurality of protrusions arranged in an array, each column of the protrusions are arranged in a direction parallel to the length direction of the first separation wall, each row of the protrusions are arranged in a direction parallel to the length direction of the second separation wall, the first groove is formed between any two adjacent columns of protrusions, and a third groove extending in a direction parallel to an extending direction of the second groove is formed between any two adjacent rows of protrusions.

5. The flexible display of claim 4, wherein the second separation wall comprises a plurality of strip-shaped protrusions extending in the length direction of the second separation wall and a second groove is formed between any two adjacent strip-shaped protrusions.

6. The flexible display of claim 1, wherein the second separation wall comprises a plurality of strip-shaped protrusions extending in the length direction of the second separation wall and the second groove is formed between any two adjacent strip-shaped protrusions.

7. The flexible display of claim 1, wherein the second separation wall comprises a plurality of protrusions arranged in an array, each row of the protrusions are arranged in a direction parallel to the length direction of the second separation wall, each column of the protrusions are arranged in a direction parallel to the length direction of the first separation wall, the second groove is formed between any two adjacent rows of protrusions, and a fourth groove extending in a direction parallel to an extending direction of the first groove is formed between any two adjacent columns of protrusions.

8. The flexible display of claim 1, further comprising a thin film transistor (TFT), a first passivation layer and anodes formed successively on the first flexible substrate, wherein the TFT, the first passivation layer and the anodes are disposed between the pixel defining layer and the first flexible substrate.

9. The flexible display of claim 8, wherein at least one of the first separation wall and the second separation wall is deep enough to contact the first passivation layer.

10. The flexible display of claim 1, wherein the first separation wall has two or more protrusions, and the second separation wall has two or more protrusions.

11. The flexible display of claim 1, wherein a second passivation layer and a second flexible substrate are successively disposed on a side of the cathode away from the first flexible substrate, wherein the second flexible substrate is bonded to a side of the second passivation layer away from the cathode by a bonding layer.

12. The flexible display of claim 1, wherein the flexible display has a configuration of top-emission, bottom-emission, or inverted flexible display.

13. The flexible display of claim 1, wherein the pixel defining layer is made of a resin material.

14. A method of manufacturing a flexible display, comprising:
forming a thin film transistor (TFT) on a first flexible substrate;
forming a first metal layer on the TFT and patterning the first metal layer by a patterning process to form an anode pattern;
forming a resin material layer and forming a pixel defining layer pattern comprising a plurality of first separation walls and a plurality of second separation walls by grayscale exposure patterning process, wherein the first separation wall comprises protrusions protruding toward a side away from the first flexible substrate, tops of the protrusions have an arc shape in cross section of the first separation wall perpendicular to a length direction of the first separation wall, and the first separation wall further comprises a first groove with an opening away from the first flexible substrate and extending in the length direction of the first separation wall, and the second separation wall comprises protrusions protruding toward a side away from the first flexible substrate, tops of the protrusions have an arc shape in cross sections of the second separation wall perpendicular to a length direction of the second separation wall, and the second separation wall further comprises a second groove with an opening away from the first flexible substrate and extending in the length direction of the second separation wall; and forming a second metal layer as a cathode on the pixel defining layer pattern, wherein a part of the cathode that faces against the first separation wall is disposed along a surface of the first separation wall and has a curve shape conform to the first groove, a part of the cathode that faces against the second separation wall is disposed along a surface of the second separation wall and has a curve shape conforming to the second groove.

15. The method of claim 14, wherein the step of forming the pixel defining layer pattern comprising a plurality of first separation walls and a plurality of second separation walls by grayscale exposure patterning process comprises:

forming a plurality of first separation walls and a plurality of second separation walls by grayscale exposure patterning process, such that the protrusions are formed on a side of the first separation wall away from the first flexible substrate and the protrusions are formed on a side of the second separation wall away from the first flexible substrate.

16. The method of claim 14, wherein the first separation wall comprises a plurality of strip-shaped protrusions extending in the length direction of the first separation wall and the first groove is formed between any two adjacent strip-shaped protrusions.

17. The method of claim 14, wherein the first separation wall comprises a plurality of protrusions arranged in an array, each column of the protrusions are arranged in a direction parallel to the length direction of the first separation wall, each row of the protrusions are arranged in a direction parallel to the length direction of the second separation wall, the first groove is formed between any two adjacent columns of protrusions, and a third groove extending in a direction parallel to an extending direction of the second groove is formed between any two adjacent rows of protrusions.

18. The method of claim 14, wherein the second separation wall comprises a plurality of strip-shaped protrusions extending in the length direction of the second separation wall and the second groove is formed between any two adjacent strip-shaped protrusions.

19. The method of claim 14, wherein the second separation wall comprises a plurality of protrusions arranged in an array, each row of the protrusions are arranged in a direction parallel to the length direction of the second separation wall, each column of the protrusions are arranged in a direction parallel to the length direction of the first separation wall, the second groove is formed between any two adjacent rows of protrusions, and a fourth groove extending in a direction parallel to an extending direction of the first grooves is formed between any two adjacent columns of protrusions.

20. The method of claim 14, wherein the first separation wall comprises two or more protrusions, and the second separation wall comprises two or more protrusions.

* * * * *